US007589010B2

(12) United States Patent
Farnworth et al.

(10) Patent No.: US 7,589,010 B2
(45) Date of Patent: Sep. 15, 2009

(54) SEMICONDUCTOR DEVICES WITH PERMANENT POLYMER STENCIL AND METHOD FOR MANUFACTURING THE SAME

(75) Inventors: Warren M. Farnworth, Nampa, ID (US); Alan G. Wood, Boise, ID (US); James M. Wark, Boise, ID (US); David R. Hembree, Boise, ID (US); Syed Sajid Ahmad, Boise, ID (US); Michael E. Hess, Kuna, ID (US); John O. Jacobson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 478 days.

(21) Appl. No.: 11/210,606

(22) Filed: Aug. 23, 2005

(65) Prior Publication Data

US 2006/0003569 A1 Jan. 5, 2006

Related U.S. Application Data

(63) Continuation of application No. 10/191,424, filed on Jul. 8, 2002, now Pat. No. 6,998,334.

(51) Int. Cl.
*H01L 21/44* (2006.01)

(52) U.S. Cl. ............... 438/614; 438/613; 257/E21.023; 257/E21.476

(58) Field of Classification Search ................. 438/106, 438/64, 55, 51, 26, 25, 15, 613, 614; 257/E21.023, 257/E21.476
See application file for complete search history.

(56) References Cited

U.S. PATENT DOCUMENTS 5,196,371 A 3/1993 Kulesza et al.
5,359,928 A 11/1994 Blessington et al.
5,460,316 A 10/1995 Hefele
5,762,259 A 6/1998 Hubacher et al.
5,990,230 A 11/1999 Muramatsu et al.
6,054,761 A 4/2000 McCormack et al.
6,089,151 A 7/2000 Cobbley et al.
6,138,348 A 10/2000 Kulesza et al.
6,150,726 A 11/2000 Feilchenfeld et al.
6,159,769 A 12/2000 Farnworth et al.
6,207,475 B1 3/2001 Lin et al.
6,211,049 B1 4/2001 Farrar
6,228,678 B1 5/2001 Gilleo et al.
6,238,223 B1 5/2001 Cobbley et al.
6,242,935 B1 6/2001 Akram
6,251,488 B1 6/2001 Miller et al.
6,253,675 B1 7/2001 Mayer
6,259,962 B1 7/2001 Gothait
6,263,566 B1 7/2001 Hembree et al.

(Continued)

OTHER PUBLICATIONS

Miller et al., "Maskless Mesoscale Materials Deposition", Deposition Technology, Sep. 2001, pp. 20-22.

(Continued)

*Primary Examiner*—Davienne Monbleau
*Assistant Examiner*—Monica D Harrison
(74) *Attorney, Agent, or Firm*—Traskbritt

(57) ABSTRACT

Methods of manufacturing semiconductor devices using permanent or temporary polymer layers having apertures to expose contact pads and cover the active surfaces of the semiconductor devices.

20 Claims, 10 Drawing Sheets

U.S. PATENT DOCUMENTS

| | | | |
|---|---|---|---|
| 6,268,584 B1 | 7/2001 | Keicher et al. | |
| 6,294,837 B1 | 9/2001 | Akram et al. | |
| 6,314,641 B1 | 11/2001 | Akram | |
| 6,316,289 B1 | 11/2001 | Chung | |
| 6,391,251 B1 | 5/2002 | Keicher et al. | |
| 6,593,220 B1 | 7/2003 | Yu et al. | |
| 6,787,923 B2 | 9/2004 | Tan et al. | |
| 6,911,173 B2 | 6/2005 | Farnworth | |
| 6,924,171 B2 * | 8/2005 | Buchwalter et al. | 438/106 |
| 2001/0017414 A1 | 8/2001 | Gilleo | |
| 2002/0171177 A1 | 11/2002 | Kritchman et al. | |
| 2003/0043360 A1 | 3/2003 | Farnworth | |
| 2003/0151167 A1 | 8/2003 | Kritchman et al. | |
| 2004/0014255 A1 | 1/2004 | Grigg et al. | |
| 2004/0165362 A1 | 8/2004 | Farnworth | |

OTHER PUBLICATIONS

Miller, "New Laser-Directed Deposition Technology", Microelectronic Fabrication, Aug. 2001, p. 16.

http://www.sysopt.co.kr/pdf/fullCure700(sysopt).pdf, Objet FullCure 700 Series, Photopolymer Materials and Support Resins, visited Aug. 2005, 2 pages.

http://www.2objet.com/Tech/howitworks.html, Objet, How it Works, visited Aug. 2005, 2 pages.

* cited by examiner

SEMICONDUCTOR DEVICES WITH PERMANENT POLYMER STENCIL AND METHOD FOR MANUFACTURING THE SAME

CROSS-REFERENCE TO RELATED APPLICATION

This application is a continuation of application Ser. No. 10/191,424, filed Jul. 8, 2002, now U.S. Pat. No. 6,998,334, issued Feb. 14, 2006.

BACKGROUND OF THE INVENTION

1. Field of the Invention

The present invention relates generally to electronic packaging in the semiconductor industry. More specifically, the present invention relates to electronic components using a permanent or temporary barrier or underfill layer of a polymer material containing apertures that also acts as a stencil in the application of solder and flux mixtures or polymer conductive pastes to effect mechanical and electrical connections of the substrates to electronic circuits.

2. State of the Art

Electronic devices—a combination of a plurality of electronic components, such as resistors, capacitors, inductors, transistors, and the like, mechanically and electrically mounted to contact pads interconnected by conductive paths in a substrate or printed circuit board (PCB)—are essential gadgets of modern life found in equipment or technologies ranging from everyday items such as televisions, microwaves, and simple digital clocks to all sorts of sophisticated medical equipments, computers, airplanes, and satellites. As these different technologies become more and more sophisticated and advanced, the manufacturers of electronic devices or integrated circuits are faced with the conflicting requirement of packing significantly higher numbers of electronic components on substrates that continue to shrink in size because of the ever-increasing desire of component and equipment miniaturization. Therefore, as the size of semiconductor devices decreases with each generation, a greater precision is required in placing and connecting the different electronic components to the substrates.

Initially, electronic components were mounted to printed circuit boards by feeding component leads through predrilled holes and soldering the leads to the contact pads on the circuit board. Such a mounting approach made it simple to remove and repair defective components by melting the previously deposited solder, removing the inoperative element, and soldering a new one in its place. As the size of integrated circuits decreased and the number of components in a board increased, surface mounting technologies were developed to allow the electronic elements to be mounted directly to the surface of the printed circuit board (PCB), thus reducing the size of contact pads and their proximity in the board. FIG. 1 of the prior art illustrates an electronic circuit assembly 2 wherein an electronic component 4 is surface-mounted to a PCB or substrate 8. Hereinafter, like elements are identified by like numbers to facilitate the description and disclosure of the invention. First, contact pads 10 at the end of electric connections 12 disposed on a PCB surface, corresponding to the same pattern of connector leads or surface contacts 6 in the electronic component, are supplied with a uniform amount of solder. Secondly, once the electronic component 4 is placed on the appropriate contact pads on top of the PCB or substrate 8, the solder paste is melted momentarily and subsequently allowed to cool, thus forming the desired mechanical and electrical connection between the connector leads 6 and contact pads 10. Other forms of surface mounting electronic components to high-density semiconductor packages are also available, including ball grid array (BGA), chip-on-board, tape automated bonding, or flip-chip methods to mention a few.

Until recently, the use of metal masks or stencils was one of the preferred methods to apply solder paste onto PCB surfaces for connecting the contact pads of surface-mounted components. FIG. 2 of the prior art illustrates generally a PCB/stencil assembly 14 for this purpose. Stencil 16, with a plurality of apertures 18 formed in predetermined locations corresponding to the pattern of the contact pads 10 on the PCB or substrate 8, is placed near or on the PCB surface, aligned over the contact pads to which the solder paste is to be applied, and removed after the solder paste is deposited. A sectional view of this solder deposition process taken along line A-A of FIG. 2 for a single aperture is illustrated in FIGS. 3A-3C of the prior art. In the solder bump manufacturing apparatus 20 of FIG. 3A, the stencil 16 is placed on the surface of the PCB or substrate 8, its aperture 18 aligned with the contact pad 10, and solder paste 24 is deposited on the top surface of the stencil 16, and, by use of a solder applicator 22, forced into each aperture 18 as shown in FIG. 3B. Subsequently, as shown FIG. 3C, the stencil 16 is removed, leaving on each contact pad 10 a solder bump 28.

Current metal stencil fabrication processes include chemical etching, electropolishing, and laser cutting. In chemical etching, the desired aperture pattern on a brass or stainless steel sheet is created by selectively removing material by a chemical process. Because of the nature of the process, (i) uncertainty in the size and position of the solder pads is common due to misregistration errors, (ii) only limited stencil aspect ratios (thickness to diameter ratio) are possible, and (iii) accurate etching is nearly impossible when fine-pitched pads are mixed with wide pads since etching speed is dependent on pad width. Electropolishing is similar to chemical etching with the exception of an additional electrochemical etching step that attempts to smooth the surface of aperture walls; therefore, a typical electropolished stencil still has all of the drawbacks associated with an etched stencil, although paste release is enhanced to a certain degree because of the relatively smoother aperture walls. Electroformed stencils are formed by plating a suitable desired metal on a substrate having the desired aperture shapes thereon. Electroformed stencils have smooth aperture shapes and smooth surfaces. Laser cut stencils are made by removing material from the metal stencil with a laser beam. Laser cut metal stencils are significantly more expensive and the aperture sidewalls are relatively rough, with uncontrolled buildup as molten metal redeposits upon cooling. This limits the usefulness of the finer geometry in a laser cut stencil as solder pastes will not release well.

One of the limitations on how much an electronic circuit can shrink in size is associated with the soldering process just summarized. This is so because it is important that an equal amount of solder paste be placed on top of each contact pad so as to assure that the component will not be mounted crookedly, each and every connection will be made, and contact pads in proximity of one another will not be inadvertently shorted or bridged because of excess solder paste. These limitations are exacerbated when one considers, for example, that currently, tolerances in PCB using flip-chip technology are critical and spacing between chips on the circuit board are typically in the range of 0.2 to 3.0 mils.

Besides the aforementioned problems associated with the use of metal stencils for the application of solder for surface mounting electronic components, i.e., variation on the amount of solder deposited in each contact pad, including bridging caused by solder excess, the technique is plagued with several other problems. First, the ratio of the height to the occupied area of the resulting solder bump is limited and variation on solder amount from bump to bump is affected by the release of the solder paste from the apertures in the stencil. As the aperture dimensions decrease, the base cross-sectional area of the aperture decreases, however, it is still desirable to keep the material being applied through the aperture in the stencil at the same vertical size or height, or greater. Further, such material applied through the apertures of the stencil must be placed very close together. Unfortunately, current technology requires that as the vertical size or height increases, the base cross-sectional area of an aperture of the stencil must increase as well for release of the material applied through the apertures. This limits the pitch or spacing of the apertures in the stencil. Further, because it is difficult to perfectly seal the lower edge of the aperture against the top surface of the contact pad, solder material leaks, depositing paste on unwanted locations on the substrate. FIG. 4 of the prior art illustrates a metal stencil design 20' disclosed in U.S. Pat. No. 5,460,316, issued Oct. 24, 1995, that attempts to solve these two problems by providing apertures with tapered walls, so that the aperture is wider or has a larger cross-sectional base area on the substrate side to provide an improved release of the material from the aperture, and with raised lower edges 26 in order to minimize the solder leakage problem. Unfortunately, since the taper of the aperture in the stencil is small, with the aperture wall being substantially vertical, the material applied through the aperture can be pulled away from the substrate when the stencil is removed, thus resulting in the same problem that the modified metal stencil design attempted to solve.

FIGS. 5A-5C of the prior art (U.S. Pat. No. 6,089,151, issued Jul. 18, 2000) illustrates yet another improvement to metal stencil designs 20" in order to minimize the problem of insufficient deposition and/or removal of solder material deposited on a contact pad after a metal stencil is removed. The stencil 16 consists primarily of an aperture 18 having walls 19 and 21 of two different diameters, thus minimizing the wall shear stress between the stencil and the solder material being applied to the semiconductor device. Since the material only contacts a small area of the portion formed by the first wall 19 of the aperture in the stencil (as shown in FIG. 5B), substantially all the material applied through the aperture remains on the semiconductor device and not in the aperture of the stencil. However, although the problem of solder removal when the stencil is lifted is minimized (FIG. 5C), the pitch or spacing of the apertures in the stencil is reduced because of the required larger aperture diameter next to the substrate surface.

Another known problem of these metal stencils is that their quality deteriorates with time because of damage, particularly the edges and junctions between the upper surface of the stencil and the sidewalls of the apertures, caused by mechanical pressure applied by solder applicators as individual stencils are normally used several times over in high-volume manufacturing processes. In order to ameliorate this wear problem, as illustrate in FIG. 6 of the prior art, wear-resistant metal stencils 16 have been proposed with a protective diamond coating 30 covering the exposed edges of the metal stencil (U.S. Pat. No. 5,460,316, issued Oct. 25, 1995). Although the wear problem is reduced, the price of the stencil is certainly increased because of the need for the additional protective coating made of an expensive material.

Another typical problem of surface mounting is the fact that the materials used to make the electronic components, the solder, and the circuit board have different coefficients of thermal expansion. During operation, increases in temperature will cause the circuit board to expand more than the component or chip, while cooling produces the opposite result. The net effect is that the joints or solder contacts are strained, resulting in early fracture failures. A solution to this problem is the use of an underfill or barrier material between the substrate and the electronic component. An underfill can be thought of as an adhesive that mechanically couples the low-expansion chip to the high-expansion substrate, including the solder joints. As chip assembly becomes better understood and reliable packaging methods become available in the marketplace, mounting methods that increase productivity are highly desirable. Together with application of solder and flux materials, underfill processes are clearly the bottlenecks to increased productivity in the manufacturing of these electronic devices.

Recently, as an attempt to ameliorate some of the problems with fabrication and use of metal stencils, U.S. Pat. No. 6,253,675, issued Jul. 3, 2001, discloses a polymer solder paste stencil printing apparatus and method for applying a controlled pattern and volume of solder paste onto a single area array component site on a populated PCB for rework or repair purposes. The stencil is a disposable, adhesive-backed, flexible membrane with several apertures and including a periphery area that can be folded or shaped to fit into the available space to be stenciled. In use, a protective, adhesive-backed layer is removed, the stencil is locally attached to the surface of the PCB to be repaired, solder is applied, and the removable, adhesive-backed stencil is peeled from the PCB and disposed of. As previously discussed, the need to peel off the adhesive-backed stencil will certainly lead to variations in the amount of deposited solder material in the different apertures, leading to problems of uneven mounting and/or possibly shorting or bridging because of excess solder paste that may still leak through.

The use of a permanently attached polymer stencil is disclosed in U.S. Pat. No. 6,228,678, issued on May 8, 2001, wherein a polymer material is applied to the surface of a semiconductor wafer as an underfill and processed to form apertures, exposing contact pads in the semiconductor wafer. The apertures are filled with a solder material, extending a distance above the underfill polymer material, and, separately from the solder paste application process, a flux material is either applied to the face of the entire semiconductor wafer or, alternatively, only to the portion of the bumps that extends above the underfill material. Problems with this technique include (i) the reduction in chip productivity associated with the separate application steps of solder and flux; (ii) the wasteful use of excess solder material extending a distance beyond the underfill material because solder is generally expensive and unfriendly to the environment when excess amounts have to be discarded; and (iii) difficulties in handling the substrate with excess solder and flux on it because of the sticky nature of these materials.

Accordingly, surface mounting electronic components or chips using permanent and/or temporary polymer underfills or barriers attached to the face of the substrate that also act as stencils in the application of solder/flux pastes or polymer stencils that can later be removed after reflow would be advantageous to overcome the problems inherent in the prior art solutions.

BRIEF SUMMARY OF THE INVENTION

The present invention is directed to semiconductor devices, and methods of manufacturing the same, that use permanent or temporary polymer layers to cover active surfaces thereof. The polymer layers have apertures that are made either before or after applying the polymer layers to the semiconductor devices, exposing the contact pads on the active surfaces of the semiconductor devices. Several preferred methods to fabricate the polymer layers can be used, including, for example, photolithographic and stereolithographic processes. When applied temporarily, the polymer layer will act as a polymer stencil for the application of solder/flux mixtures or polymer conductive pastes to the exposed contact pads before reflow to form contact bumps for connecting electronic components to the semiconductor devices. If applied permanently, besides serving the stencil purpose for the application of solder/flux mixtures or polymer conductive pastes, the polymer layer will also act as a barrier material, minimizing the problems associated with different coefficients of thermal expansion between the semiconductor devices, solder bumps, and electronic components connected thereto.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention relates to polymer layers deposited on a surface of a substrate to act as either a temporary polymer stencil in an application of solder paste that is later removed after reflow of the solder paste or a permanent polymer stencil for the application of solder paste that is not removed after reflow but remains on the substrate surface and acts as an underfill or barrier layer.

Figure 1:
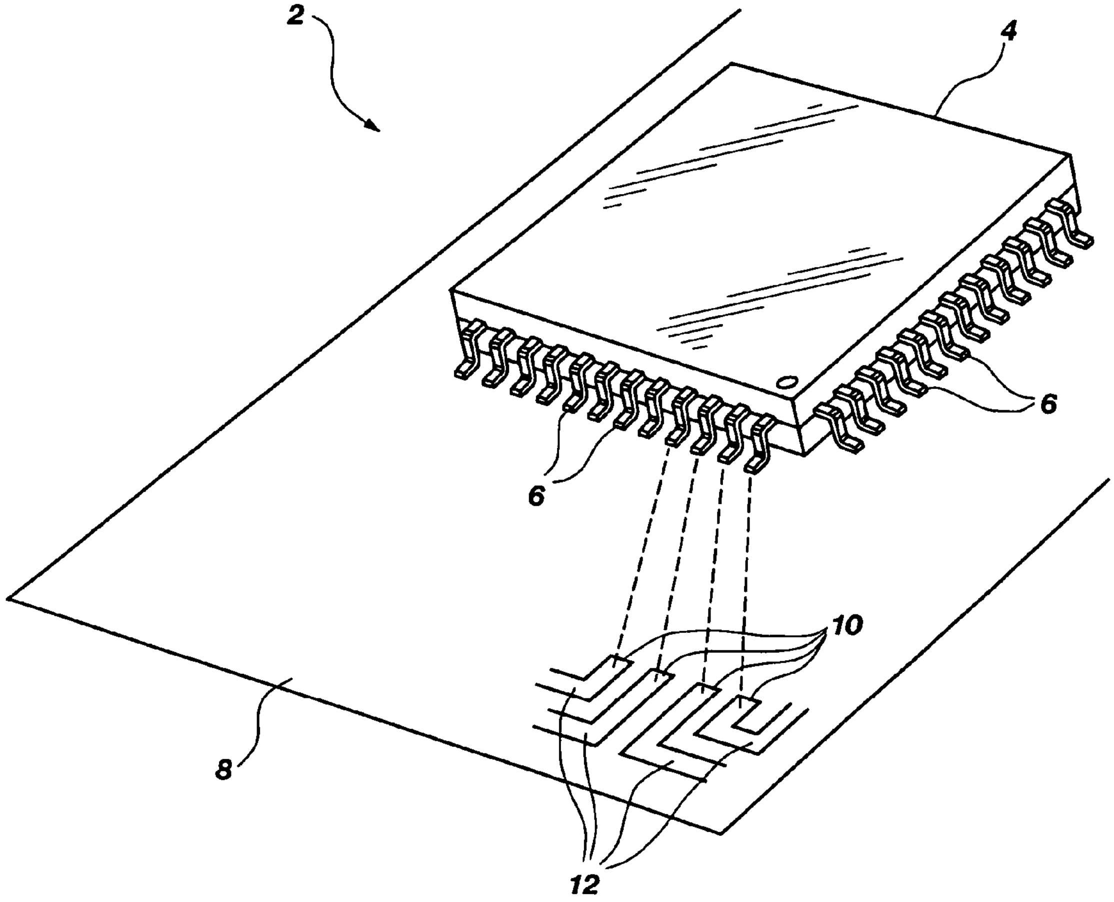
FIG. 1 of the prior art is a schematic of an electronic circuit assembly illustrating an electronic component surface-mounted to a PCB or substrate.
Figure 2:
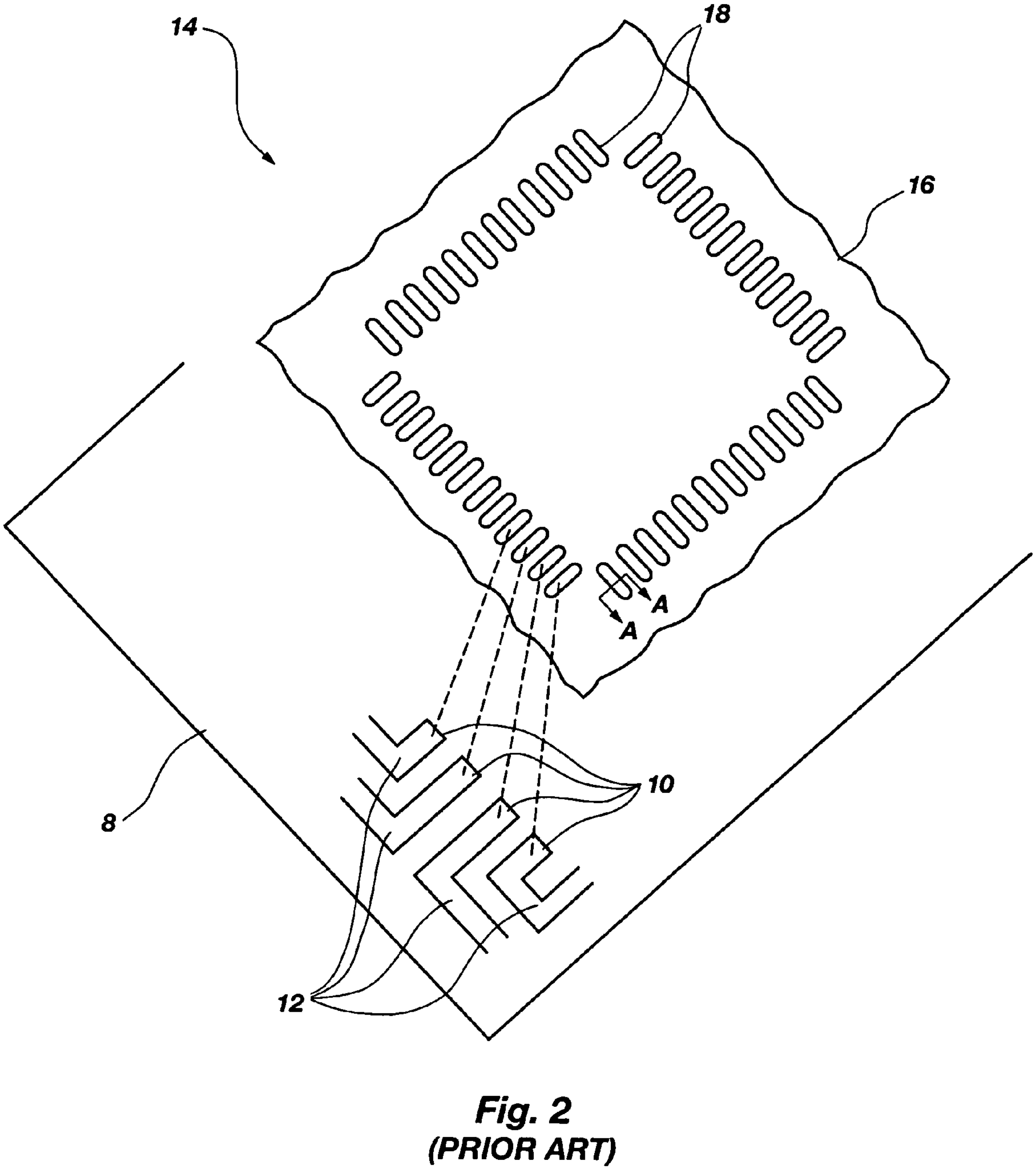
FIG. 2 of the prior art is a schematic of a PCB/stencil assembly illustrating the use of a metal stencil with apertures for depositing solder paste to contact pads in a PCB or substrate for the purpose of surface-mounting an electronic component thereto.
Figure 3A:
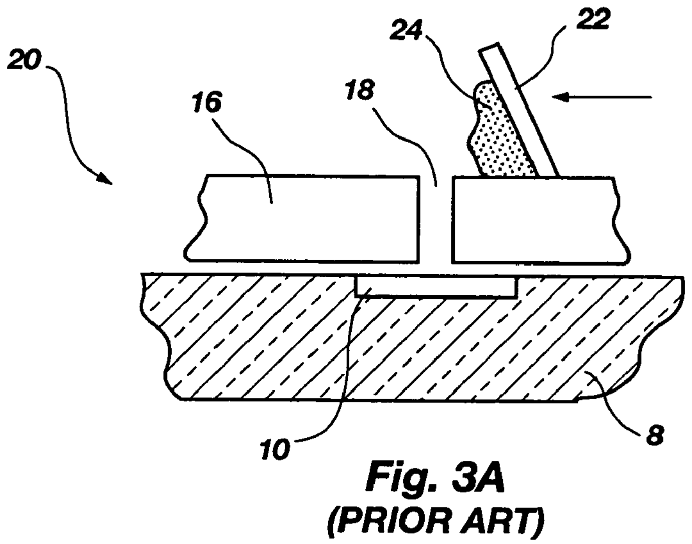
FIGS. 3A-3C of the prior art are sectional views along line A-A of FIG. 2 illustrating the formation of a solder bump on the contact pad of a substrate, including steps of disposing a metal stencil on top of the substrate (FIG. 3A), depositing and forcing solder paste in an aperture of the metal stencil (FIG. 3B), and subsequent removal of the metal stencil before reflow (FIG. 3C)
Figure 3B:
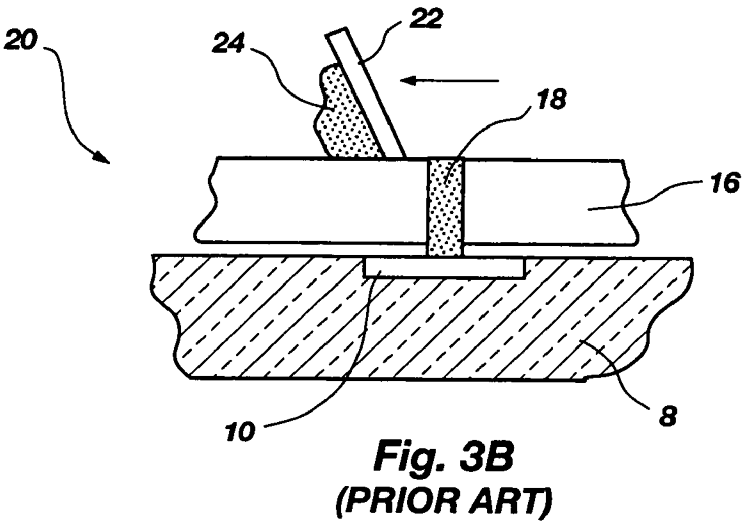
Figure 3C:
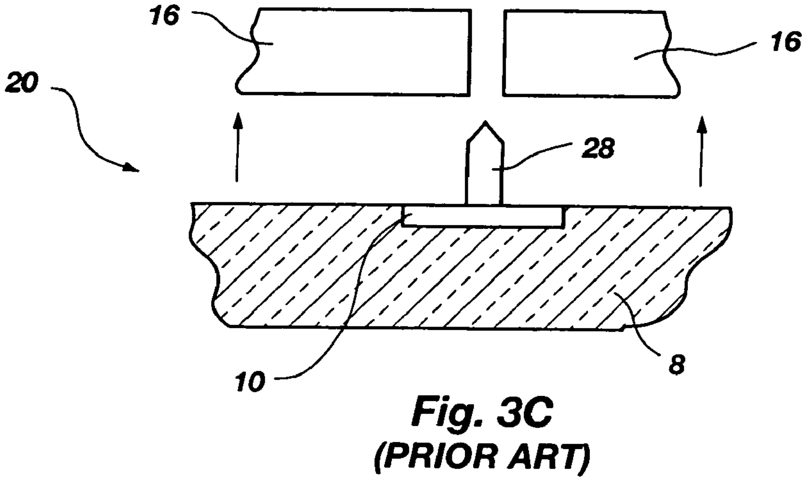
Figure 4:
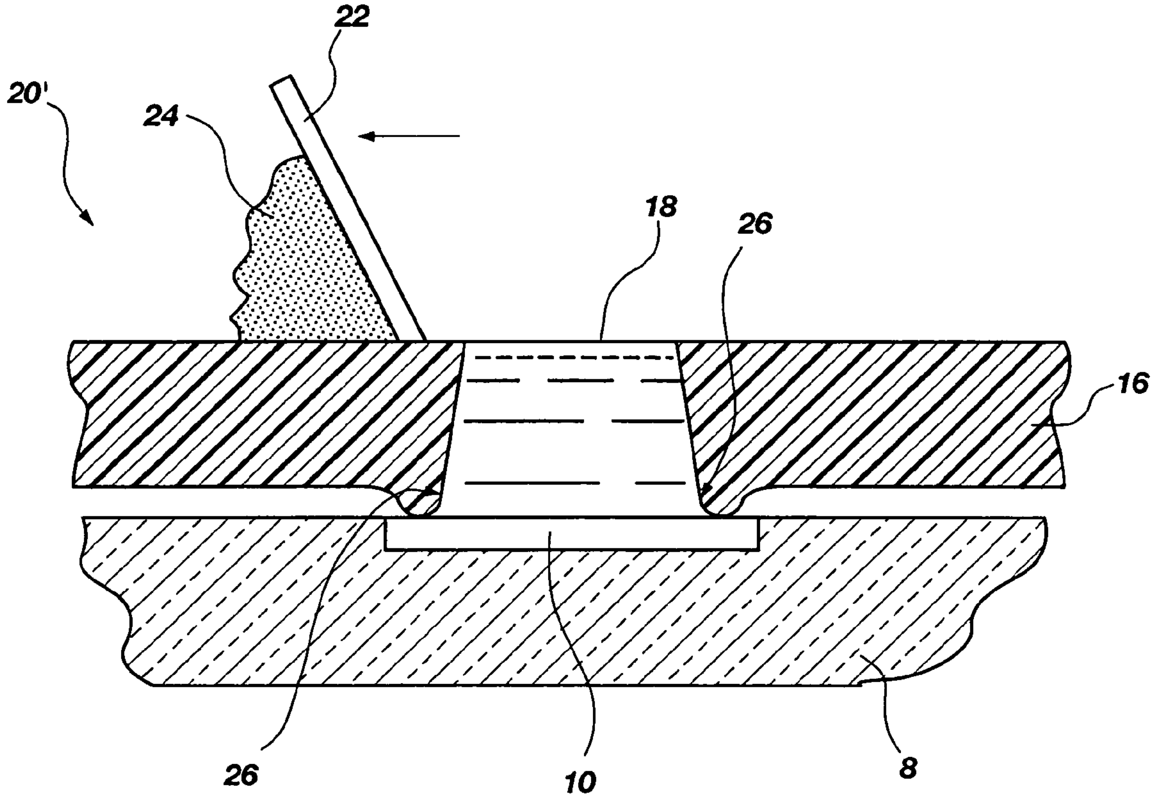
FIG. 4 of the prior art illustrates a metal stencil with tapered walls and raised lower edges to minimize solder leakage and release problems.
Figure 5A:
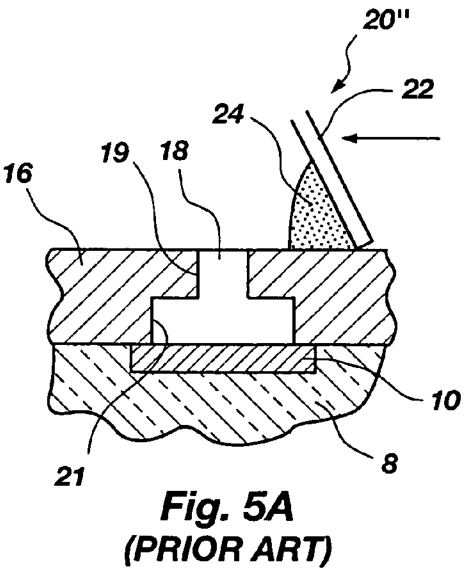
FIGS. 5A-5C of the prior art illustrate another metal stencil with apertures having two different diameters to minimize the problem of insufficient deposition and/or removal of solder material deposited on a contact pad after a metal stencil is removed.
Figure 5B:
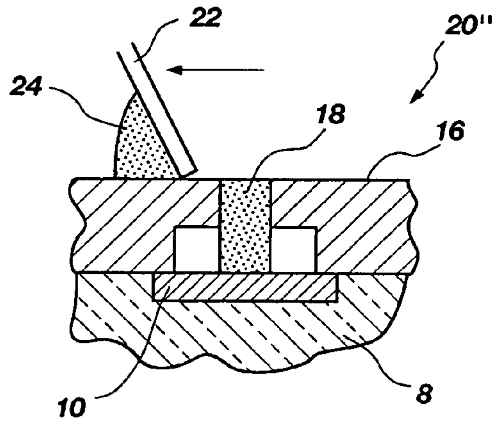
Figure 5C:
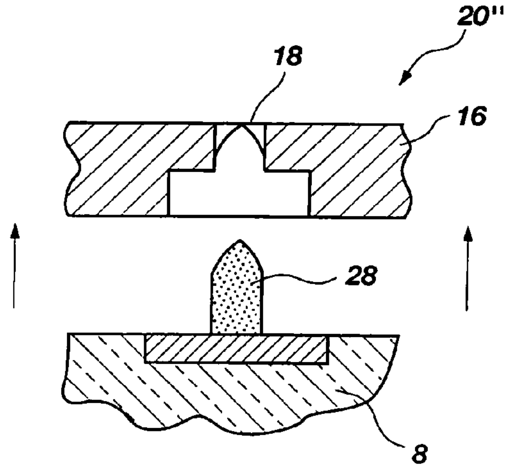
Figure 6:
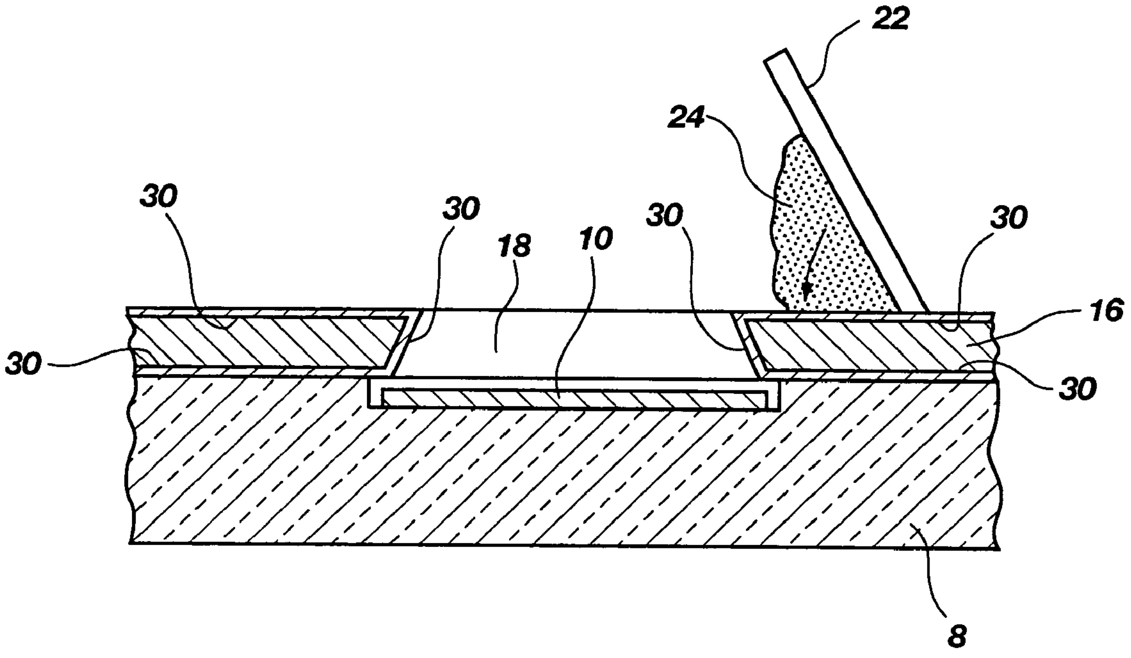
FIG. 6 of the prior art illustrates a wear-resistant metal stencil with a protective diamond coating covering exposed edges thereof.
Figure 7A:
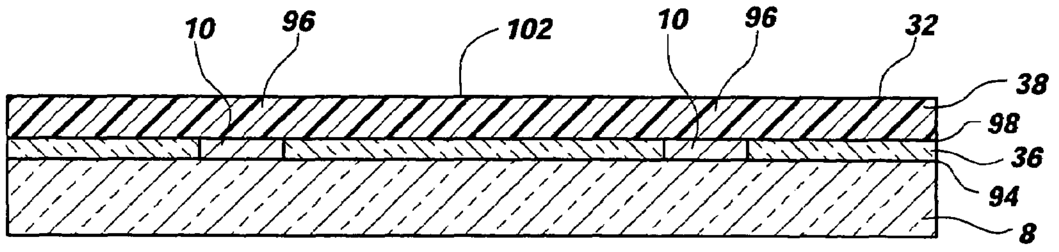
FIGS. 7A-7D illustrate one of the preferred embodiments of the present invention wherein a polymer layer is deposited on an active surface of a substrate (FIG. 7A), apertures are formed therein (FIG. 7B) and filled with a solder and flux mixture (FIG. 7C), and the deposited mixture is reflowed to form solder bumps (FIG. 7D)

FIGS. 7A-7D illustrate a polymer stencil/underfill assembly 32 manufactured according to the method of the present invention. Initially, as shown in FIG. 7A, a substrate 8 is provided with contact pads 10 together with an isolation layer 36 disposed on top of an active surface 94 of a substrate 8, wherein the isolation layer 36 surrounds the contact pads 10 so as to expose only a top surface 96 thereof. The term "active surface" is used herein to denote an actual surface as well as vertical projections thereof. Two contact pads 10 are illustrated in FIGS. 7A-7D, but, as known to one of ordinary skill in the art, the invention disclosed herein is not limited by the number of contact pads in the substrate surface; therefore, substrate 8 may have only one contact pad 10 or a plurality of contact pads 10 disposed thereon. A polymer layer 38 is then disposed on top of a surface 98 of the isolation layer 36 covering also the top surface 96 of the contact pads 10. Polymer layer 38 can be a single layer of material or it can be composed of a plurality of sublayers, each superimposed, contiguous with, and mutually adhered to the other, depending on the manufacturing method used to deposit the layer as further disclosed hereinbelow.

Figure 7B:
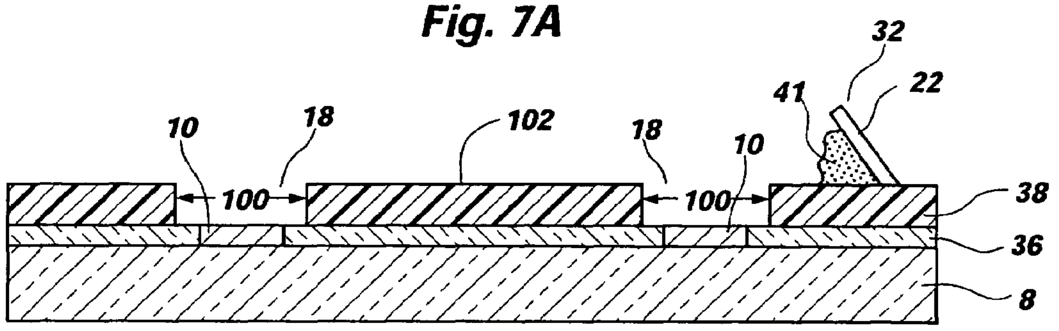
Figure 7C:
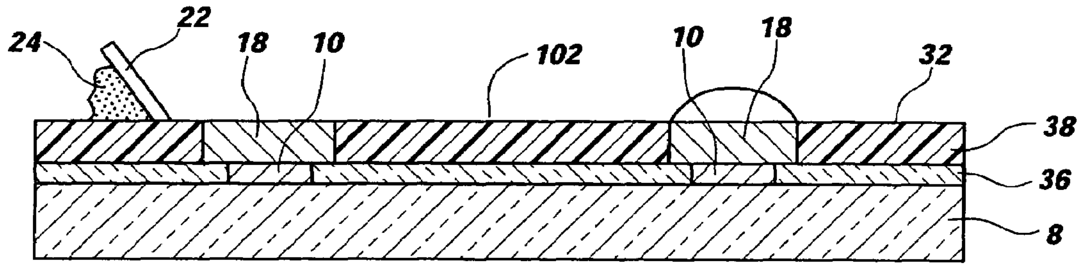
Figure 7D:
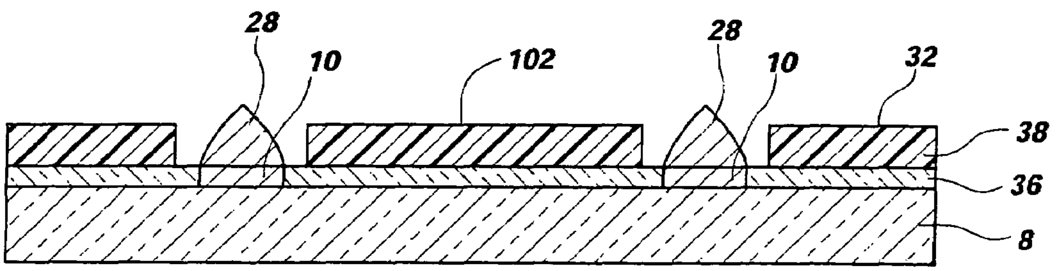

Subsequently, as illustrated in FIG. 7B, apertures 18 are developed in the polymer layer 38 so as to expose the contact pads 10. Depending on the type of solder paste to be used, apertures 18 could have at least the same or larger cross-sectional dimensions 100 and the same or a different cross-sectional shape as that of the contact pads 10 as illustrated in FIG. 7B. Once apertures 18 are formed in the polymer layer 38, a mixture of solder and flux 41 is applied using solder applicator 22 so as to fill apertures 18 to a level that is even with a top surface 102 of the polymer layer 38 (FIG. 7C). As indicated in FIG. 7D, solder bumps 28 are then formed by raising the temperature of the polymer stencil/underfill assembly 32 sufficiently to cause the mixture of solder and flux 41 to reflow. Subsequent connection of the polymer stencil/underfill assembly 32 to an electronic circuit can be effected by positioning it relative to the circuit such that each of the solder bumps 28 contacts a corresponding contact pad thereon and applying sufficient heating to cause the solder bumps 28 to melt and form a permanent mechanical and electrical contact between the assembly and the electronic circuit. Further, another embodiment of the present invention uses the polymer layer 38 only as a stencil for the application of the mixture of solder and flux 41 and formation of the solder bumps 28 after reflow; thus, the polymer layer 38 may be removed before effecting the connection of the polymer stencil/underfill assembly 32 to an electronic circuit just described.

Polymer layer 38 may be deposited using a variety of techniques available in the art, including photolithographic processes, deposition of a mixture of a solvent and polymer material and subsequent evaporation of the solvent, spraying a sheet of polymer material using film coaters, meniscus coating, spin coating, stencil or screen printing, needle deposition, or separately curing a layer of polymer and later attaching this layer on a substrate surface as a preform. Further, attaching the preform layer to the active surface 94 may be accomplished, for example, by use of an adhesive layer disposed on the surface of the preform to be attached or by use of heating after disposing the preform onto the active surface 94. Also, formation of the apertures in the preform may be accomplished by any of the methods disclosed hereinbefore or after the preform is attached to the substrate.

In photolithographic processes, the substrate is coated with a photoresist, i.e., a photosensitive material, which is later exposed to ultraviolet light by use of a pattern in a glass plate in order to mark material to be removed or left on the substrate surface. Photosensitive materials may be of a positive or negative type. In the positive-type photoresist, material protected by it is removed by wet, or chemical etching, or by dry or sputter etching. Contrariwise, when using the negative-type photoresist, material not protected by the photoresist is removed by the same techniques.

In the past decade, a manufacturing technique termed "stereolithography," also known as "layered manufacturing," has evolved to a degree where it is employed in many industries. Another preferred embodiment of the instant invention is to use stereolithography to deposit the polymer layer 38 and to form apertures therein. Essentially, stereolithography, as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers. The mathematical simulation or model is then employed to generate an actual object by building the object, layer by superimposed layer.

A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries. The layer of material is selectively consolidated or fixated to at least a semisolid state in those areas of a given layer corresponding to portions of the object, the consolidated or fixed material also at that time being substantially concurrently bonded to a lower layer. The unconsolidated material employed to build an object may be supplied in particulate or liquid form and the material itself may be consolidated, fixed or cured, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size. When a liquid is employed, resolution is highly dependent upon the minimum surface area of the liquid which can be fixed (cured) and the minimum thickness of a layer which can be generated, given the viscosity of the liquid and other parameters, such as transparency to radiation or particle bombardment (see below) used to effect at least a partial cure of the liquid to a structurally stable state. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges from lasers or other radiation sources.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive for the same, such as in the case of plastic objects conventionally formed by injection molding. Stereolithography is also employed in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. As disclosed hereinabove, stereolithography is another method used in the present invention for the deposition of the polymer layer 38.

Figure 8:
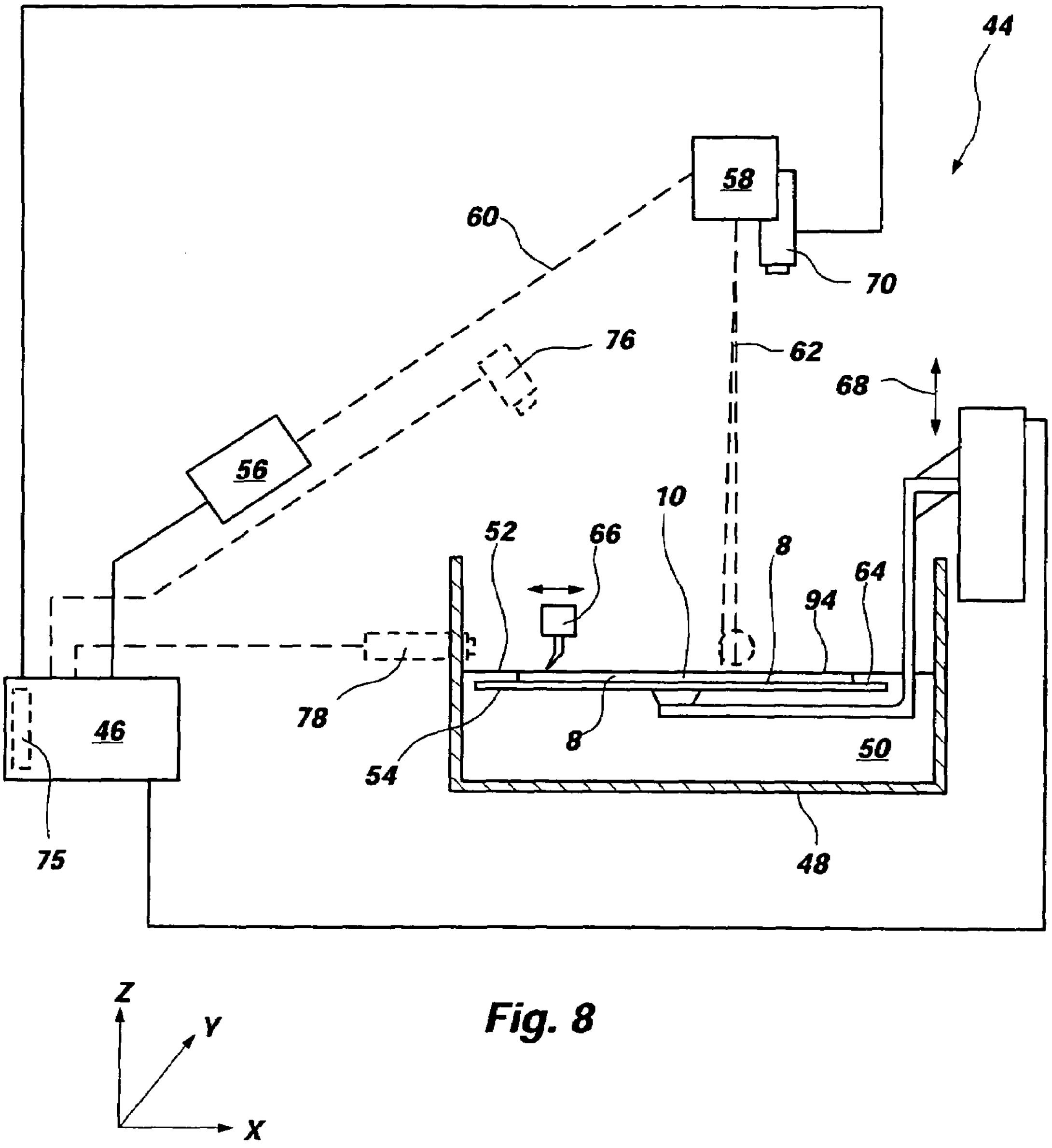
FIG. 8 is a perspective view of a stereolithographic apparatus exemplifying one of the preferred embodiments of the present invention to deposit a polymer layer on an active surface of a substrate and to form apertures thereon.

FIG. 8 schematically depicts various components and operation of an exemplary stereolithography apparatus 44 to facilitate the reader's understanding of the technology employed in implementation of one of the preferred methods to deposit the polymer layer 38 in the present invention, although those of ordinary skill in the art will understand and appreciate that apparatus of other designs and manufacture may be employed in practicing such methods. The preferred stereolithography apparatus for implementation of the present invention, as well as operation of such apparatus, are described in great detail in United States patents assigned to 3D Systems, Inc. of Valencia, Calif., such as patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298;

5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by reference.

Improvements in a conventional stereolithographic apparatus relate to a so-called "machine vision" system in combination with suitable programming of the computer controlling a stereolithographic process. This improvement eliminates the need for accurate positioning or mechanical alignment of workpieces to which material is stereolithographically applied. Referring to FIG. 8, alignment of a laser beam or other fixing agent may be item specific (i.e., substrate specific) so that a large number of distinct semiconductor devices may each be accurately coated with a polymer layer 38 to the same or differing specifications with regard to numbers of sublayers and layer thickness.

With reference to FIG. 8 and as noted above, a 3-D CAD drawing of an object such as a polymer layer 38 to be fabricated in the form of a data file is placed in the memory of a computer 46 controlling the operation of apparatus 44 if computer 46 is not a CAD computer in which the original object design is effected. In other words, an object design may be effected in a first computer in an engineering or research facility and the data files transferred via wide or local area network, tape, disc, CD-ROM or otherwise as known in the art to computer 46 of apparatus 44 to fabricate the polymer layer 38 or another object comprising one or more applied sublayers. Each sublayer is formed or consolidated by a pass of a laser beam 62 into a layer of photocurable material or photopolymer, resulting in a partial cure of a deposited material. Each sublayer may also be additionally cured by further exposing it to a secondary curing for further solidification of a sublayer material, including curing by increasing an assembly's temperature. Such additional curing step may be either partial or full before another sublayer of material is subsequently deposited until a desired thickness of the final polymer layer is obtained. It should also be understood by one of ordinary skill in the art that in the stereolithographic process of depositing polymer layer 38, apertures may be formed therein by purposely not curing and later removing some of the material in the unconsolidated state from at least the contact pad areas.

The data are preferably formatted in an STL-type computer file, STL being a standardized format employed by a majority of manufacturers of stereolithography equipment. Fortunately, the format has been adopted for use in many solid-modeling CAD programs, so often translation from another internal geometric database format is unnecessary. In the particular case where the apparatus 44 is to be used for applying only a single polymer layer 38 of uniform thickness, the program may be somewhat simplified.

Apparatus 44 also includes a reservoir 48, which may comprise a removable reservoir interchangeable with others containing different materials, of liquid material 50 to be employed in applying the intended polymer layer 38 of protective material to the substrate 8. In a currently preferred embodiment, the liquid material 50 is a photocurable polymer (hereinafter "photopolymer") responsive to light in a UV wavelength range. The surface level 52 of the liquid material 50 is automatically maintained at a precise, constant magnitude by devices known in the art responsive to output of sensors within apparatus 44, including leveling device 66, and preferably under control of computer 46, hardware and software 75, and cameras 70, 76, and 78. A support platform or elevator 54, precisely vertically movable in fine, repeatable increments in directions 68 responsive to control of computer 46, is located for movement downward into and upward out of liquid material 50 in reservoir 48. A UV wavelength range laser plus associated optics and galvanometers (collectively identified as laser 56) for controlling the scan of laser beam 60 in the X-Y plane across platform 54 has associated therewith mirror 58 to reflect beam 60 downwardly as beam 62 toward surface 64 of platform 54, or more particularly toward surface 94 of a substrate 8 positioned on surface 64. Beam 62 is traversed in a selected pattern in the X-Y plane, that is to say in a plane parallel to surface 64, by initiation of the galvanometers under control of computer 46 to at least partially cure, by impingement thereon, selected portions of liquid material 50 disposed over surface 94 to at least a semisolid state. The use of mirror 58 lengthens the path of the laser beam 60, effectively doubling same, and provides a more vertical beam 62 than would be possible if the laser 56 itself were mounted directly above platform surface 64, thus enhancing resolution.

It should also be understood by one of ordinary skill in the art of the present invention that the exemplary methods described herein to form polymer layers in a single substrate are also applicable and operational for a wafer containing several semiconductor dice followed by singulation of the resulting assembly into individual dice. Further, while the invention is described in terms of a liquid material polymerizable to a semisolid and/or solid, the process may be varied to use a powdered material, for example. The term "unconsolidated" will be used herein to denote the unpolymerized material, which becomes "altered" or "consolidated" by the laser radiation to at least a semisolid state.

Different polymeric materials can be used to form the polymer layer 38, depending on the method used to deposit the layer and whether or not the layer will remain on the substrate surface as an underfill after the reflow procedure. Polymer layers 38 can be made of thermoplastic or thermoset materials. Examples of thermoplastic materials to be used in the present invention include phenoxy resins, acrylic resins, methacrylic resins, polycarbonate resins, polyamid resins, polybutene resins, polyester resins, polyolefin resins and mixtures thereof. If the material will remain as an underfill, its composition can be changed so as to control its coefficient of thermal expansion, thus minimizing cyclic strain on the solder connections due to heating and cooling encountered during normal operation of electronic devices. Normally, when thermoset epoxies are used as underfill material, fillers, such as silica particles, are used as additives in order to control the coefficient of thermal expansion of the resulting mixture. Also, if the polymer layer 38 will not be removed after the reflow operation, the reflow temperature profile is more closely monitored so as to minimize adverse effects to the polymer layer 38 that will remain as an underfill or barrier on the substrate 8. If the polymer layer 38 is used as a temporary polymer stencil, the effect of reflow temperature may be neglected and its removal after reflow may be accomplished, as, for example, by melting the temporary polymer stencil during or after the reflow operation.

Several methods exist in the art to make apertures 18 in the polymer layer 38, such as, for example, laser machining, including optical diffraction and photoablation using different types of lasers. Other aperture fabrication processes include chemical etching, electropolishing, laser cutting, and various combinations thereof. Also, polymer layer 38 may be formed separately from the substrate as a preform with apertures already formed therein and later laminated to the substrate surface by use of an adhesive layer applied to the appropriate surface of the polymer layer 38. Otherwise, the preform layer can also be applied to the substrate surface and attached thereto by the application of heating either separately or concurrently with the solder paste reflow process. One of the preferred methods to develop apertures 18 in the polymer layer 38 in the present invention is to use stereolithography. One of the advantages of depositing polymer layer 38 using stereolithography is the fact that the geometry of apertures 18 can be varied so as to minimize disturbing the solder paste deposited on top of the contact pads 10 in case the polymer layer 38 is used as a polymer stencil and thus removed after applying the solder paste and reflow.

Typically, solder paste is a high viscosity material made as a mixture of fine solder particles, the size of the particle being associated with the type of solder, such as types 1 through 5, and flux. Typically, the diameters of solder particles are chosen as the largest possible that can be used in a given application. It should be clear to one of ordinary skill in the art that use of a solder paste instead of the sequential application of separate solder material and flux will significantly minimize the overall time required to complete the packaging process and thus increase productivity. Methods to be used in applying the solder paste are those well known in the art, including a squeegee or solder applicator 22, stencil or screen printing, and pin transfer.

Figure 9A:
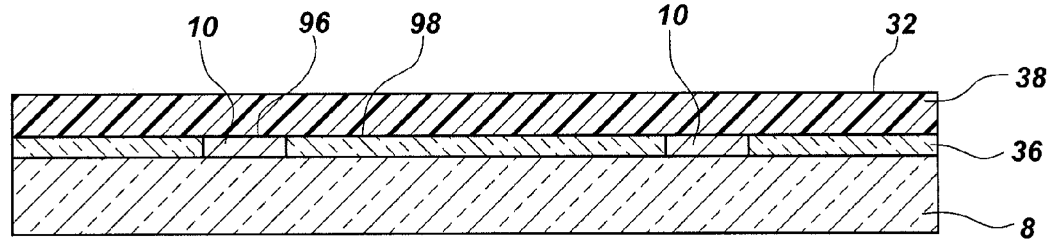
FIGS. 9A-9D illustrate another one of the preferred embodiments of the present invention, wherein a removable polymer layer is deposited on an active surface of a substrate (FIG. 9A), apertures are formed therein (FIG. 9B) and filled with a polymer conductive paste (FIG. 9C), and the polymer layer is removed if desired before an electronic component is cured, effecting the desired mechanical and electrical contact with the substrate (FIG. 9D)
Figure 9B:
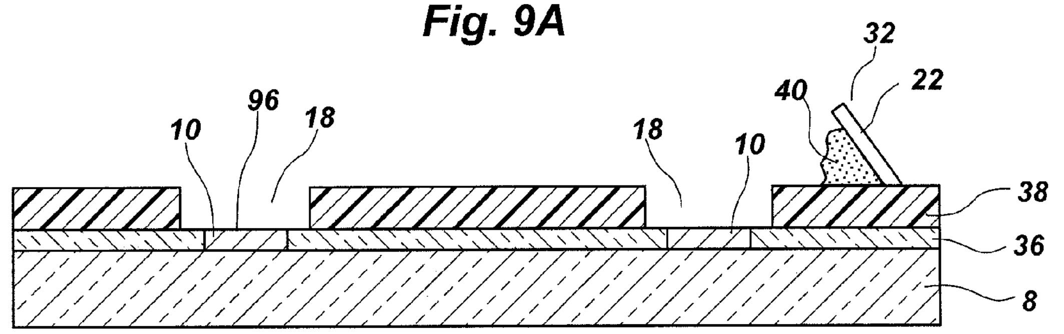

FIGS. 9A and 9B illustrate another preferred embodiment of the present invention, wherein a polymer stencil/underfill assembly 32 is manufactured according to the method of the present invention as described hereinabove. Initially, as shown in FIG. 9A, a substrate 8 is provided with contact pads 10 disposed on an active surface 94 thereof together with an isolation layer 36 deposited on top of the active surface 94 and surrounding the contact pads 10 so as to expose only the top surface 96 of the contact pads 10. A polymer layer 38 is then disposed on top of the surface 98 of the isolation layer 36 covering also the top surface 96 of the contact pads 10.

Figure 9C:
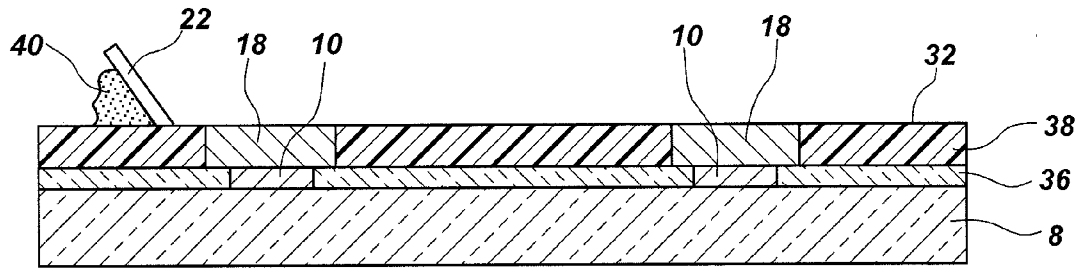
Figure 9D:
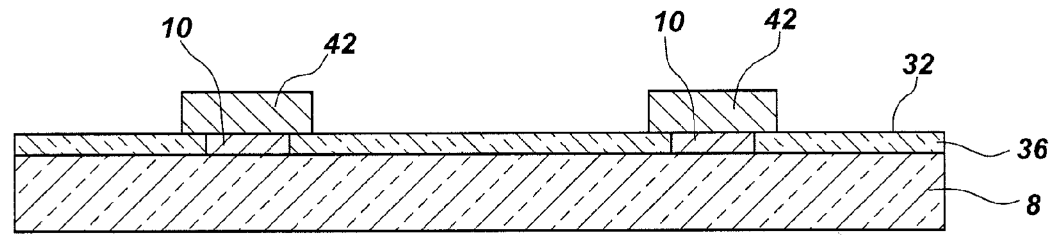

Subsequently, as illustrated in FIG. 9B, apertures 18 are developed in the polymer layer 38 so as to expose the contact pads 10. Once apertures 18 are formed in the polymer layer 38, a polymer conductive paste 40 is applied using the same methods and techniques previously described (FIG. 9C). As indicated in FIG. 9D, polymer bumps 42 can be exposed by simply removing the polymer layer 38 before connecting the assembly to other electronic components and curing the polymer bumps after the resulting assembly is connected to an electronic circuit in order to effect a permanent mechanical and electrical contact.

Figure 10:
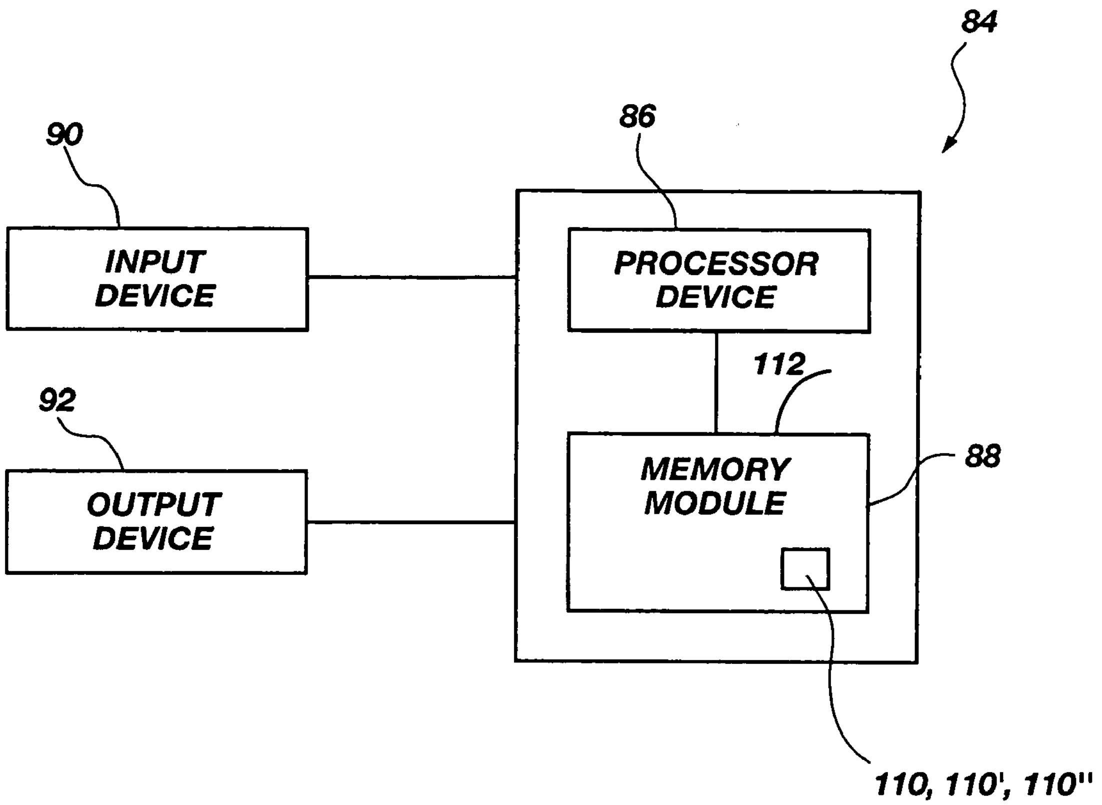
FIG. 10 illustrates a block diagram of a computer system, wherein electronic components are connected to printed circuit boards or the like using the methods and procedures of the present invention.

Referring now to the drawing of FIG. 10 where a schematic is illustrated of an electronic system 84, such as a personal computer, including input device 90 (such as a keyboard and mouse) and an output device 92 (such as a display or printer interface) coupled or otherwise in electrical communication with a processor device 86. Processor device 86 is also coupled or otherwise in operable electrical communication such as through traces of a mother board with one or more memory modules 88 incorporating one or a plurality of electronic packages manufactured according to the present invention such as 110, 110', 110" or variations thereof. The memory module 88 may include a memory board 112 having an electrical circuit formed therein, such as a PCB. Furthermore, processor device 86 may be directly embodied in a module with several electronic packages that incorporate the teachings hereof and further include, without limitation, a microprocessor, a first level cache memory, or a memory management processor. Variations of the electronic system 84 shown in FIG. 10 should be understood by persons of ordinary skill in the art to include not only systems to implement the embodiments of the present invention disclosed herein but others as well.

Although a few typical embodiments and details have been explained hereinabove with the intention of illustrating several best modes of the present invention related to applying permanent polymer underfill layers or temporary polymer stencils to the face of electronic substrates, it will be clear to those persons of ordinary skill in the art that several changes and variations in the methods, apparatuses and systems disclosed herein may be implemented within the scope of the present invention to be used in electronic packaging methods, such as, for example, direct chip attachment, flip-chip attachment, wafer scale attachment, etc. The scope of the invention is then appropriately determined by the claims appended below, particularly pointing out and distinctly claiming the subject matter that the applicants regard as their invention.

What is claimed is:

1. A method of connecting a semiconductor device having an active surface with at least one contact pad exposed thereover to an electronic circuit, comprising:

substantially simultaneously applying multiple sub-layers of unconsolidated polymer material to use radiation to selectively consolidate the unconsolidated polymer material into at least a semi-solid state being substantially concurrently bonded to a lower layer thereby creating a single layer of polymer material with embedded consolidated polymer material structures;

removing the unconsolidated polymer material to form apertures in the consolidated polymer material structures so that at least one aperture extends through the consolidated polymer material structures and exposes only at least one contact pad;

applying a mixture of solder and flux to the at least one aperture so as to fill the at least one aperture to a level that is even with a top surface of the consolidated polymer material structure; and removing consolidated polymer material structures before connecting the semiconductor device to an electronic circuit.

2. The method of claim 1, further comprising singulating at least one semiconductor device from a wafer when the semiconductor device is in wafer form.

3. The method of claim 1, wherein the substantially simultaneously applying multiple sub-layers comprises:

selecting at least one portion of the active surface to be covered with at least a first layer of material; and forming the at least a first layer of material by:

applying the at least a first layer of material in an unconsolidated state to the at least one portion of the active surface; and selectively altering a state of the at least a first layer of material over at least a portion of the at least one portion of the active surface from the unconsolidated state to at least a semisolid state, while leaving material over other portions of the at least one portion of the active surface in the unconsolidated state.

4. The method of claim 3, wherein the applying the at least a first layer of material in an unconsolidated state comprises applying the material in a liquid state.

5. The method of claim 3, wherein the selectively altering comprises selectively altering the state of the at least a first layer of material over the at least a portion of the at least one portion of the active surface to have a thickness substantially the same as a desired thickness of the at least a first layer of material in the at least semisolid state.

6. The method of claim 3, wherein the selectively altering comprises directing a controlled, discrete beam of radiation onto the at least a first layer of material located over the at least one portion of the active surface.

7. The method of claim 6, wherein the directing comprises directing a controlled, discrete beam of focused ultraviolet laser radiation.

8. The method of claim 3, wherein the forming the at least a first layer of material comprises forming the at least a first layer of material from a liquid resin controllably curable to a solid state.

9. The method of claim 3, further comprising:

selecting at least a second portion of the active surface covered with the at least a first layer of material to be covered with at least a second layer of material;

forming the at least a second layer of material when the at least a second layer of material is in an unconsolidated state over the at least a second portion of the active surface, the at least a second layer of material being superimposed, contiguous with, and mutually adhered to the at least one portion of the at least a first layer of material; and selectively altering a state of the at least a second layer of material over at least a portion of the at least a second portion of the active surface from the unconsolidated state to at least a semisolid state while leaving protective material of the at least a second layer over other regions of the active surface in the unconsolidated state.

10. The method of claim 9, further comprising subjecting the at least a second layer of material in the at least semisolid state to a secondary curing for further solidifying the at least a second layer of material.

11. The method of claim 10, wherein the secondary curing comprises increasing temperature of the at least one semiconductor device.

12. The method of claim 1, wherein the formation of the at least one aperture further comprises removing at least some of the at least a second layer of material in the unconsolidated state from the at least one contact pad on the semiconductor device.

13. The method of claim 12, further comprising subjecting the at least a first layer of material in the semisolid state over the semiconductor device to a substantially full cure.

14. The method of claim 3, wherein the selectively altering comprises leaving the at least a first layer of material in the unconsolidated state over the at least one contact pad.

15. The method of claim 1, further comprising storing data including at least one physical parameter of the semiconductor device in computer memory and using the stored data in conjunction with a machine vision system to recognize a location and orientation of the at least one contact pad over the semiconductor device and the at least one selected portion of the active surface of the semiconductor device.

16. The method of claim 15, further comprising using the stored data, in conjunction with the machine vision system, to selectively form the at least a first layer of material stereolithographically over the at least one selected portion of the active surface of the semiconductor device.

17. A method of connecting a semiconductor device to an electronic circuit in a wafer having a plurality of semiconductor devices, at least one semiconductor device having an active surface with at least one contact pad exposed thereover, comprising:

substantially simultaneously applying multiple sub-layers of unconsolidated polymer material and using radiation to selectively consolidate the unconsolidated polymer material into at least a semi-solid state being substantially concurrently bonded to a lower layer; thereby creating a single layer of polymer material with embedded consolidated polymer material structures;

removing the unconsolidated polymer material to form apertures in the consolidated polymer material structures so that apertures extend through the consolidated polymer material structures and expose only at least one contact pad;

applying a mixture of solder and flux to the apertures so as to fill the apertures to a level that is even with a top surface of the consolidated polymer material structures; and removing the consolidated polymer material structures before connecting the semiconductor device to an electronic circuit.

18. A method of connecting a semiconductor device to an electronic circuit of a wafer having a plurality of semiconductor devices, at least one semiconductor device having an active surface with at least one contact pad exposed thereover, comprising:

selecting at least one portion of the active surface to be covered with multiple layers of unconsolidated material to use radiation to selectively consolidate the unconsolidated polymer material into at least a semi-solid state being substantially concurrently bonded to a the active surface creating a single layer of material;

applying the multiple layers of unconsolidated material over the at least one portion of the active surface of the at least one semiconductor device using radiation to selectively consolidate the unconsolidated material into at least a semi-solid state being substantially concurrently bonded to a the active surface creating a single layer of material with embedded consolidated material structures;

forming at least one aperture in the layer of material so that the at least one aperture extends through the layer of material, exposes only the at least one contact pad, and has a cross-sectional shape that is a same shape as a cross-sectional shape of the at least one contact pad and cross-sectional dimensions that are at least a same dimension as cross-sectional dimensions of the at least one contact pad by removing the unconsolidated polymer material forming the at least one aperture in the consolidated material so that the at least one aperture extends through the consolidated material and exposes only at least one contact pad; and applying a conductive polymer paste to the at least one aperture so as to fill the at least one aperture to a level that is even with a top surface of the layer of material.

19. A method of connecting a semiconductor device having an active surface with at least one contact pad exposed thereover to an electronic circuit, comprising:

substantially concurrently applying multiple sub-layers of unconsolidated polymer material to use radiation to selectively consolidate the unconsolidated polymer material into at least a semi-solid state being substantially concurrently bonded to a lower layer; thereby creating a single layer of polymer material with embedded consolidated polymer material structures;

removing the unconsolidated polymer material to form apertures in the consolidated polymer material structures so that apertures extend through the consolidated polymer material structures and expose only at least one contact pad;

applying a mixture of solder and flux to the apertures so as to fill the apertures to a level that is even with a top surface of the consolidated polymer material structures; and removing the consolidated polymer material structures before connecting the semiconductor device to an electronic circuit.

20. A method of connecting a semiconductor device having an active surface with at least one contact pad exposed thereover to an electronic circuit, comprising:

applying multiple sub-layers of unconsolidated polymer material at about the same time to use radiation to selectively consolidate the unconsolidated polymer material into at least a semi-solid state being substantially concurrently bonded to a lower layer; thereby creating a single layer of polymer material with embedded consolidated polymer material structures;

removing the unconsolidated polymer material to form apertures in the consolidated polymer material structures so that at least one aperture extends through the consolidated polymer material structures and exposes only at least one contact pad;

applying a mixture of solder and flux to the at least one aperture so as to fill the at least one aperture to a level that is even with a top surface of the consolidated polymer material structures; and removing the consolidated polymer material structures before connecting the semiconductor device to an electronic circuit.

* * * * *

UNITED STATES PATENT AND TRADEMARK OFFICE

CERTIFICATE OF CORRECTION

PATENT NO. : 7,589,010 B2
APPLICATION NO. : 11/210606
DATED : September 15, 2009
INVENTOR(S) : Warren M. Farnworth et al.

It is certified that error appears in the above-identified patent and that said Letters Patent is hereby corrected as shown below:

In column 12, line 40, in Claim 1, delete “structure;” and insert -- structures; --, therefor.

In column 12, line 41, in Claim 1, delete “removing” and insert -- removing the --, therefor.

In column 14, line 27, in Claim 18, delete “a the” and insert -- the --, therefor.

In column 14, line 35, in Claim 18, delete “a the” and insert -- the --, therefor.

Signed and Sealed this

Twenty-fourth Day of November, 2009

David J. Kappos

David J. Kappos
*Director of the United States Patent and Trademark Office*

UNITED STATES PATENT AND TRADEMARK OFFICE

CERTIFICATE OF CORRECTION

PATENT NO. : 7,589,010 B2
APPLICATION NO. : 11/210606
DATED : September 15, 2009
INVENTOR(S) : Farnworth et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 849 days.

Signed and Sealed this

Twenty-first Day of September, 2010

David J. Kappos

*Director of the United States Patent and Trademark Office*